(12) United States Patent
Lee et al.

(10) Patent No.: US 9,577,430 B2
(45) Date of Patent: Feb. 21, 2017

(54) ELECTRONIC DEVICE AND METHOD OF CONTROLLING POWER SUPPLY THEREIN

(75) Inventors: Haesoo Lee, Seoul (KR); Jaehong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 974 days.

(21) Appl. No.: 13/213,916

(22) Filed: Aug. 19, 2011

(65) Prior Publication Data

US 2012/0043821 A1 Feb. 23, 2012

(30) Foreign Application Priority Data

Aug. 20, 2010 (KR) .................. 10-2010-0081013
Jul. 5, 2011 (KR) .................. 10-2011-0066437

(51) Int. Cl.
| | |
|---|---|
| H02J 1/00 | (2006.01) |
| H02J 3/00 | (2006.01) |
| H02J 3/32 | (2006.01) |
| H04B 3/54 | (2006.01) |
| H01L 31/00 | (2006.01) |
| H02J 13/00 | (2006.01) |
| H02J 3/14 | (2006.01) |

(52) U.S. Cl.
CPC .............. *H02J 3/32* (2013.01); *H01L 31/00* (2013.01); *H02J 13/0062* (2013.01); *H02J 13/0075* (2013.01); *H04B 3/54* (2013.01); *H02J 2003/146* (2013.01); *Y02B 90/222* (2013.01); *Y02B 90/2638* (2013.01); *Y02B 90/2653* (2013.01); *Y04S 20/12* (2013.01); *Y04S 40/124* (2013.01); *Y04S 40/126* (2013.01); *Y10T 307/696* (2015.04)

(58) Field of Classification Search
CPC .............. H02J 9/061; H02J 1/10; H02J 3/382; G06F 1/26; G06F 1/263; G05D 3/12; G01R 21/00; G05B 15/02; H04B 3/54; H04B 2203/5454; H04B 2203/5458
USPC .............. 307/80, 82, 84, 78, 43, 86, 66, 64; 324/500; 62/89; 700/12, 291; 136/291, 136/293; 705/35
See application file for complete search history.

(56) References Cited

U.S. PATENT DOCUMENTS

| | | | |
|---|---|---|---|
| 4,891,743 A | * | 1/1990 | May .................. G01R 31/40 363/87 |
| 8,200,370 B2 | * | 6/2012 | Paik .................. H02J 3/14 700/12 |

(Continued)

FOREIGN PATENT DOCUMENTS

WO WO 2010141859 A1 * 12/2010 .............. H04B 3/54

*Primary Examiner* — Rexford Barnie
*Assistant Examiner* — Jagdeep Dhillon
(74) *Attorney, Agent, or Firm* — Birch, Stewart, Kolasch & Birch, LLP

(57) ABSTRACT

Disclosed is an electronic device, which includes an external power supply unit configured to receive power from an external power source and an auxiliary power storage unit configured to be charged upon receiving the power from the external power supply unit and store the power. The electronic device further includes a first switching element connected to the external power supply unit and the auxiliary power storage unit, the first switching element configured to select any one of the external power supply unit and the auxiliary power storage unit as a power source, a power information receiver configured to receive power information including at least one of electric rate information and power demand information, and a controller configured to control the first switching element based on the power information received from the power information receiver.

19 Claims, 17 Drawing Sheets

(56) References Cited

U.S. PATENT DOCUMENTS

| | | | |
|---|---|---|---|
| 2003/0009401 A1* | 1/2003 | Ellis | G06Q 30/0283 |
| | | | 705/35 |
| 2003/0047209 A1* | 3/2003 | Yanai | H02J 3/32 |
| | | | 136/244 |
| 2008/0184716 A1* | 8/2008 | Furutachi | F24F 11/006 |
| | | | 62/89 |
| 2009/0001927 A1* | 1/2009 | Stamos | H02J 7/0072 |
| | | | 320/106 |
| 2010/0191487 A1* | 7/2010 | Rada | G05F 1/70 |
| | | | 702/60 |
| 2011/0001485 A1* | 1/2011 | Feight | H02J 1/10 |
| | | | 324/500 |
| 2011/0246801 A1* | 10/2011 | Seethaler | G06F 1/3218 |
| | | | 713/323 |

* cited by examiner

ELECTRONIC DEVICE AND METHOD OF CONTROLLING POWER SUPPLY THEREIN

Pursuant to 35 U.S.C. §119(a), This application claims the benefit of Korean Patent Applications No. 10-2010-0081013, filed on, Aug. 20, 2010 and No. 10-2011-0066437, filed on, Jul. 5, 2011, which are hereby incorporated by reference as if fully set forth herein.

BACKGROUND OF THE INVENTION

Field of the Invention

The present invention relates to an electronic device and a method of controlling a power supply therein, and more particularly, to an electronic device and a method of controlling a power supply therein, which provide selection of an effective power supply using power information.

Discussion of the Related Art

Recently, interest in green energy and technologies is increasing worldwide and smart grid technologies to cope with energy problems are gathering strength as important eco friendly technologies.

A smart grid is a next generation power grid that is configured to allow a power supplier and a consumer to perform and control information exchange in real time via networks, thereby optimizing energy efficiency.

Thus, each electronic device produced in future needs to be equipped with smart grid functionality and substantially, businesses addressing this issue are being developed at home and abroad.

FIG. 1 illustrates an exemplary use of a power supply in conventional general electronic devices. FIG. 1 illustrates electronic devices 10 and 20 respectively include batteries 11 and 21. These batteries 11 and 21, for example, may be integrally mounted in the electronic devices 10 and 20, or may be detachably attached to separate battery attachment/detachment modules of the electronic devices 10 and 20. Of a variety of electronic devices, in particular, portable electronic devices, such as smart phones, personal digital assistants and the like, widely employ the batteries.

In a state in which the conventional general electronic devices 10 and 20 are respectively connected to external power supplies 12 and 22 (e.g., an 'AC power supply' or 'system power supply'), the electronic devices 10 and 20 are operated by AC power fed from the external power supplies 12 and 22. Generally, the AC power is fed by a utility company and is billed on a watt/hour basis. While no power supply is connected thereto, the electronic devices 10 and 20 may be operated by the internal batteries 11 and 21. In brief, conventional electronic devices do not use a battery when a power supply is connected thereto such that power fed from the power supply serves as unique power source. In addition, when the power supply is connected to the electronic device, the power source is always used to charge the battery.

Recently, development of a new grid, obtained by integrating an analog grid with digital technologies, has been issued. As such a new digital grid is merged with information communication technologies, moreover, a method of sending and receiving power information in real time via interactive communication is being developed. One example of grid technologies now being developed is smart grid technologies that are widely referred to as an intelligent grid. Hereinafter, terms as mentioned herein, 'smart grid power information network', 'smart grid' and 'power network' mean one example of an intelligent grid enabling interactive communication. In the following description, for convenience of description, the intelligent grid is referred to as a 'smart grid power information network'. The smart grid power information network is realizable in various manners. For example, this may be realized via a widely utilized Internet network or Power Line Communication (PLC), or may be realized by standardizing other new power information networks.

As the aforementioned smart grid power information network is more actively discussed, demands for saving electricity consumption in electronic devices are increasing. It will be appreciated that discussions into saving electricity consumption via effective power supply selection pertain, in particular, to fulfill the demands. Thus, the above described conventional methods in which only an external power supply unit connected to an electronic device is unconditionally utilized as a power source or in which a battery is unconditionally charged by the external power supply unit connected to the electronic device despite that a remaining charge of the battery is sufficient may result in unnecessary power consumption and excessive economic burden to a user.

SUMMARY OF THE INVENTION

Accordingly, the present invention is directed to an electronic device and a method of controlling a power supply therein that substantially obviate one or more problems due to limitations and disadvantages of the related art.

An object of the present invention is to provide an effective power supply control method using power information and an electronic device adopting the power supply control method.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electronic device includes an external power supply unit configured to receive power from an external power source, an auxiliary power storage unit configured to be charged upon receiving the power from the external power supply unit and store the power, a first switching element connected to the external power supply unit and the auxiliary power storage unit and configured to select any one of the external power supply unit and the auxiliary power storage unit as a power source, a power information receiver configured to receive power information including at least one of electric rate information and power demand information, and a controller configured to control the first switching element based on the power information received from the power information receiver.

The controller may judge a high price time zone determined from the electric rate information or an over demand time zone determined from the power demand information as a power saving time zone, and may control the first switching element to select the auxiliary power storage unit as the power source during the power saving time zone.

The electronic device may further include a second switching element to select whether or not to charge the auxiliary power storage unit with the power fed from the external power supply unit, and the controller may control the second switching element to prevent charging of the auxiliary power storage unit during the power saving time zone.

The electronic device may further include an auxiliary power amount detector configured to detect the amount of auxiliary power charged in the auxiliary power storage unit and output information about the amount of auxiliary power to the controller.

The controller may control the second switching element to allow the auxiliary power storage unit to be charged with the power fed from the external power supply unit if the amount of auxiliary power detected by the auxiliary power amount detector is a reference value or less and the power saving time zone has not arrived.

The controller may control the first switching element to select the external power supply unit as the power source if the amount of auxiliary power detected by the auxiliary power amount detector is a reference value or less.

The electronic device may further include an alternating current (AC) power input unit configured to receive AC power from an external AC power source and feed the AC power to the external power supply unit, a direct current (DC) power input unit configured to receive DC power from an external DC power storage device and feed the DC power to the external power supply unit, and a third switching element connected to the AC power input unit and the DC power input unit and configured to select any one of the AC power and the DC power as power source, and the controller may control the third switching element to select any one of the DC power and the AC power as power source based on the power information.

The controller may judge a high price time zone determined from the electric rate information or an over demand time zone determined from the power demand information as a power saving time zone and may control the third switching element to select the DC power as the power source during the power saving time zone.

The controller may control the third switching element to select the AC power as the power source if the amount of DC power stored in the external DC power storage device is a reference value or less.

The power information may further include low-price time zone electricity use restriction information for restricting at least one of amount and time of electricity usage in a low-price time zone, and the controller may be further configured to control a display to display electricity usage amount information or electricity usage time information in the low-price time zone, determine a power saving time zone based on the electricity usage amount information or the electricity usage time information, and select the auxiliary power storage unit as the power source during the power saving time zone.

In accordance with another aspect of the invention, a method of controlling a power supply in an electronic device, includes receiving power information including at least one of electric rate information and power demand information, and selecting any one of an external power supply unit, which is configured to receive power from an external source, and an auxiliary power storage unit which is charged upon receiving the power fed form the external power supply unit and stores the power, as a power source based on the power information received from a power information receiver.

The selecting may include judging a high price time zone determined from the electric rate information or an over demand time zone determined from the power demand information as a power saving time zone, and selecting the auxiliary power storage unit as the power source during the power saving time zone.

The method may further include preventing charging of the auxiliary power storage unit during the power saving time zone.

The method may further include detecting the amount of auxiliary power stored in the auxiliary power storage unit, and charging the auxiliary power storage unit with the power fed from the external power supply unit if the detected amount of auxiliary power is a reference value or less and the power saving time zone has not arrived.

The method may further include detecting the amount of auxiliary power stored in the auxiliary power storage unit, and selecting the external power supply unit as the power source if the detected amount of auxiliary power is a reference value or less.

The power may be any one of AC power fed from an external AC power source and DC power fed from an external DC power storage device, and the selecting may include selecting any one of the DC power and the AC power as power source based on the power information.

The method may further include judging a high price time zone determined from the electric rate information or an over demand time zone determined from the power demand information as a power saving time zone, and selecting the DC power as the power source during the power saving time zone.

The AC power may be selected as the power source if the amount of DC power stored in the external DC power storage device is a reference value or less.

The power information may further include low-price time zone electricity use restriction information for restricting at least one of amount and time of electricity usage in a low-price time zone.

The method may further include displaying electricity usage amount information or electricity usage time information in the low-price time zone, determining a power saving time zone based on the electricity usage amount information or the electricity usage time information, and selecting the auxiliary power storage unit as the power source during the power saving time zone.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. For reference, the embodiments are provided by way of example to explain the technical idea of the present invention and it should be understood that the technical range of the present invention is not limited to the embodiments.

Figure 1:
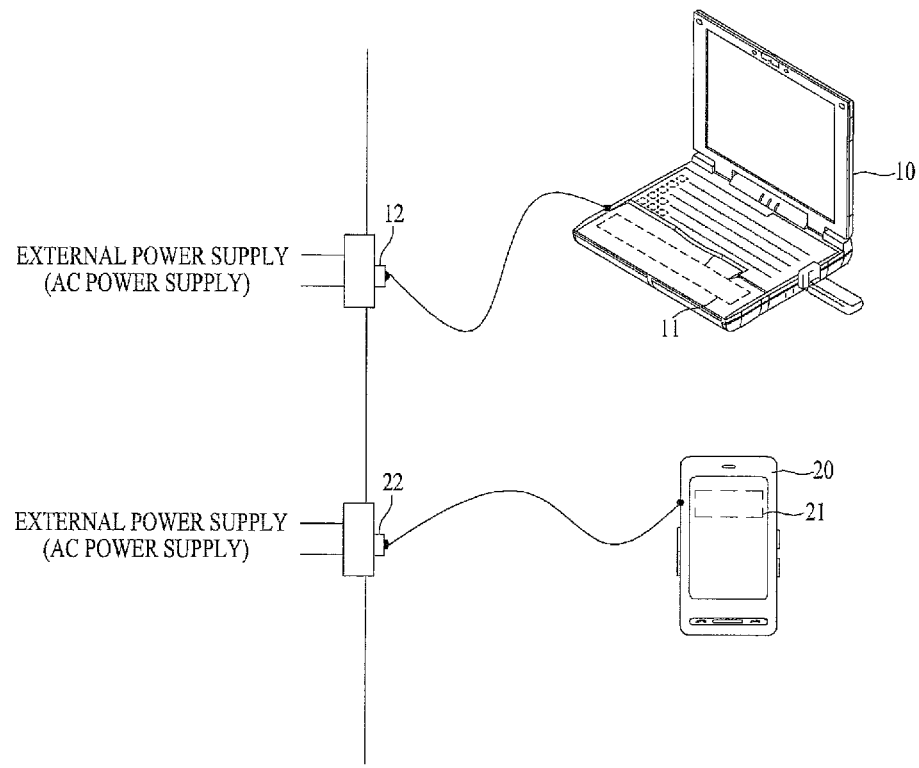
FIG. 1 is a view illustrating an exemplary use of a power supply in conventional general electronic devices.
Figure 2:
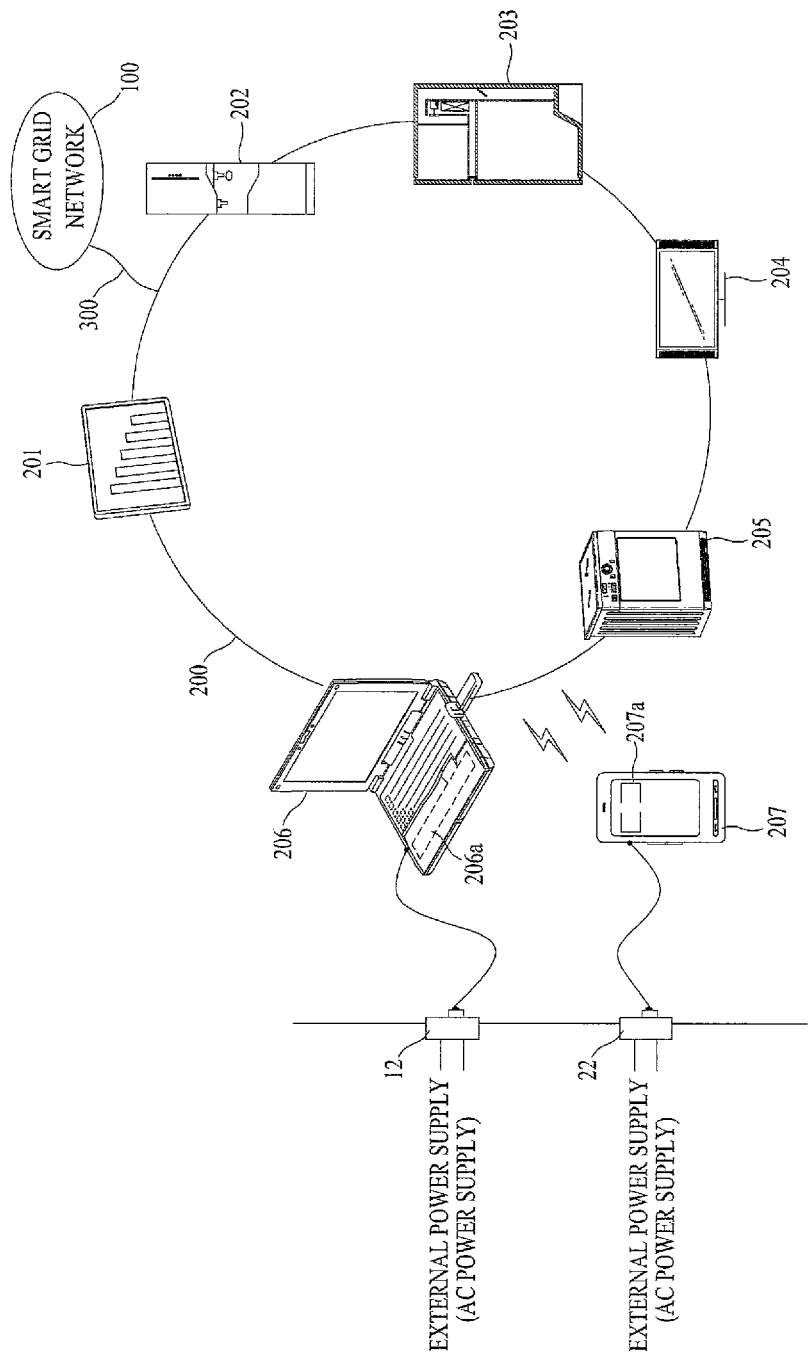
FIG. 2 is a schematic view illustrating the use of power using a smart grid power information network in accordance with a first embodiment of the present invention.

FIG. 2 is a conceptual view of various electronic devices in accordance with an embodiment of the present invention for explaining the use of power using a smart grid power information network.

A smart grid power information network 100 is accessible by several smart grid participants. A network 200 constructed in a customer (i.e., 'home network' or 'building network') is connected to the smart grid power information network 100 via a wired or wireless communication network 300. Similarly, the network 200 may be a wired or wireless communication network. The network 200 and the smart grid power information network 100 are classified merely for convenience of explanation and the network 200 may be broadly understood as a part of the smart grid power information network 100.

A variety of devices located in the customer are connected to the smart grid power information network 100 through the network 200. In one example, these devices include a smart server 201, which receives power information via the smart grid power information network 100 and controls power consumption of all devices in the customer using the power information, and electronic devices 202 to 207 which require power (referred to as 'smart appliances').

Although the electronic devices 202 to 207 may have self-control functionalities to control power consumption thereof, the electronic devices 202 to 207 may be designed to be controlled independently in response to control commands transmitted from the smart server 201 through the network 200. This will be described below in detail.

The smart server 201 may be embodied as a separate product and alternatively, any one of the electronic devices 202 to 207 may function as a smart server. For example, the smart server 201 may be replaced with an electronic device having a display function, such as a smart TV 204, a personal computer 206, a portable personal terminal 207 or the like.

Hereinafter, an effective power supply control method in accordance with the present invention will be described in relation to some products using an auxiliary power storage unit (e.g., a battery) amongst the variety of electronic devices connected to the smart grid power information network 100 through the internal network 200. In one example, the products using an auxiliary power storage unit (e.g., a battery) may include the personal computer 206 and the portable personal terminal 207. These products 206 and 207 are generally provided with a battery 206a and a battery 207a respectively to provide a user with portability. It is noted that the present embodiment is not limited to the personal computer 206 or the portable personal terminal 207 and if appropriate, may be applied to all products including fixed electronic devices, such as the smart server 201 (although it may be portable), water purifier 202, refrigerator 203, smart TV 204 and washing machine 205, so long as these devices contain an auxiliary power storage unit (e.g., a battery) therein or are connected to an external auxiliary power source (e.g., a home battery or an external battery on a per device basis) when in use.

Figure 3:
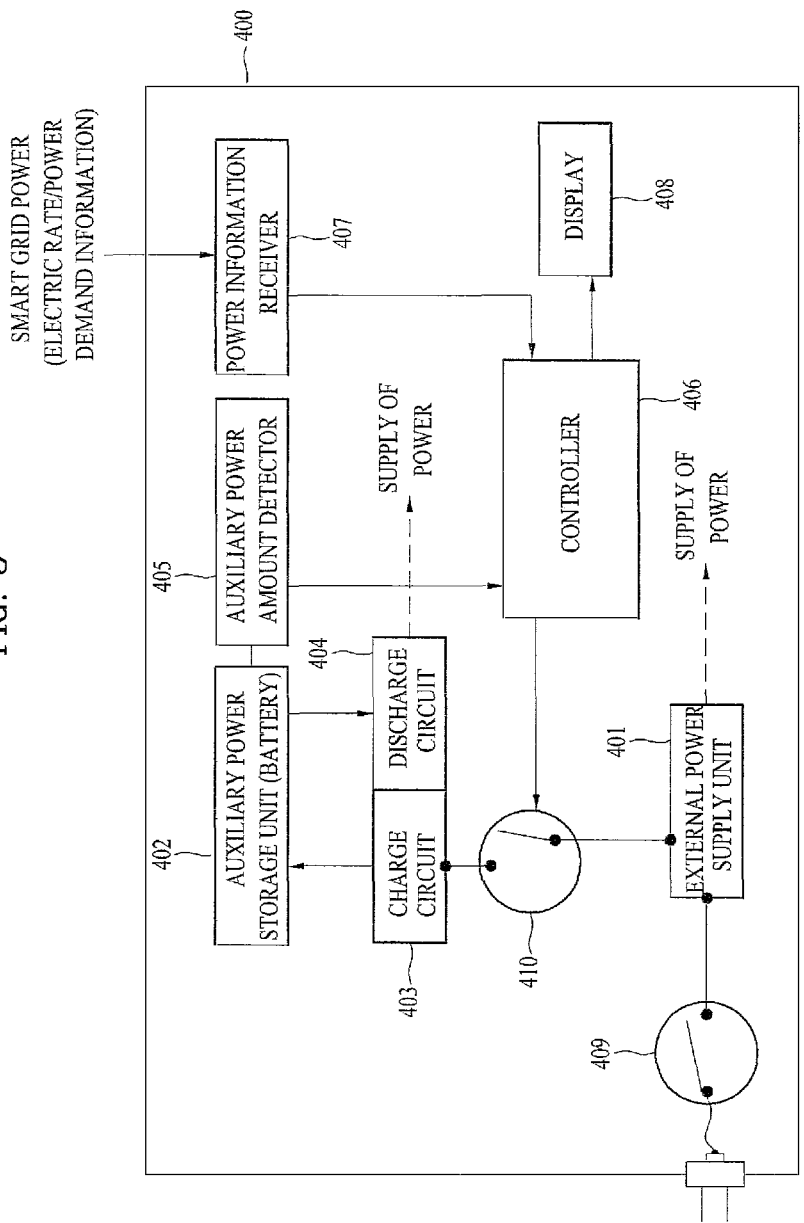
FIG. 3 is a block diagram illustrating an electronic device in accordance with a first embodiment of the present invention.

FIG. 3 illustrates an electronic device 400 in accordance with a first embodiment of the present invention. The electronic device 400 in accordance with the first embodiment of the present invention includes an external power supply unit 401, an auxiliary power storage unit 402 (hereinafter, referred to also as a 'battery'), a charge circuit 403, a discharge circuit 404, an auxiliary power amount detector 405, a controller 406, a power information receiver 407, a display 408, a first switching element 409 and a second switching element 410.

It is to be appreciated that all the aforementioned components are illustrated as functional blocks for convenience of description and may be present in the form of a tangible element or a software program in practical applications. It is also to be appreciated that in exemplary embodiments of the present invention, some of the aforementioned components are not essential, but are merely additional components.

The external power supply unit 401 receives power from an external source of electricity (e.g., a 'power supplier' or 'micro grid') to supply power to the electronic device 400. Instead of the power fed from the external source of electricity, an electric charge of which is determined by the power supplier, alternatively, power generated by a self-generation facility of a recipient (e.g., solar heat energy, wind force energy and the like) may be fed to the external power supply unit 401.

The charge circuit 403 charges the auxiliary power storage unit 402 so as to store power in the auxiliary power storage unit 402, and the discharge circuit 404 enables supply of power from the auxiliary power storage unit 402 to the electronic device 400. The auxiliary power amount detector 405 detects an available amount of power or a charged amount of power in the auxiliary power storage unit 402 and transmits the detected result to the controller 406.

The power information receiver 407 receives power information via the smart grid power information network 100 or the internal network 200. In some embodiments, the power information may be a power control command received from an external control device (e.g., the smart server 201). In addition, the power information may be given in real time or periodically at a constant time interval and may include electric rate information and/or power demand information according to design requirements. In some embodiments, the power information receiver 407 may receive information about self-generation. The information about self-generation may include information indicating the amount of power self-generated by a recipient, information indicating an available extra amount of self-generated power, and information indicating whether or not power supplied to the external power supply unit is self-generated power.

More particularly, in one example, the electric rate information means information about electric use hour that is changeable in real time or periodically. Thus, an electric charge with respect to a current time zone is ascertainable upon receiving the electric rate information and it is also ascertainable whether the current time zone corresponds to a high-price time zone or a low-price time zone on the basis of a predetermined reference. For example, the power supplier fixes an electric charge at a time of high electricity demand (referred to as a 'peak time') to a high price, which may cause a user to reduce electricity usage. On the other hand, an electric charge at a time of less electricity demand is fixed to a low price, which may cause the user to use electricity during the low-price time zone rather than the high-price time zone.

The power demand information includes information about a power demand that is changeable in real time or periodically. The power demand information is obtained by analyzing a previous power use aspect of each recipient with respect to the smart grid power information network 100 or based on information about a required wattage of power that is provided from each recipient. Thus, a power demand in a current time zone is ascertainable upon receiving the power demand information, and it is also ascertainable whether or not the current time zone corresponds to an over demand time zone or a low demand time zone on the basis of a predetermined reference. For example, an electric charge may be fixed highly in the over demand time zone of high electricity demand, or an additional incentive or penalty may be imposed regardless of an electric charge, which may cause the user to reduce electricity usage.

In this way, the controller 406 judges a power saving time zone from the power information received by the power information receiver 407 and determines selection of a power source corresponding to the power saving time zone. For example, the high price time zone or the over demand time zone may be judged as the power saving time zone. Whether a particular time belongs to the high price time zone or the over demand time zone can be freely set by the user or a system.

Meanwhile, it may be possible to restrict at least one of amount and time of electricity usage in a low-price time zone for each customer such that a sudden increase in power demand for the low-price time zone can be prevented. For example, if at least one of the amount and the time of electricity usage of a customer in a low-price time zone exceeds a restricted value, the electricity rate in the low-price time zone can be raised to same or similar to that of the high-price time zone.

The power information may include low-price time zone electricity use restriction information for restricting amount or the time of electricity usage in the low-price time zone. In This case, the controller 406 controls the display 408 to display electricity usage amount information or electricity usage time information in the low-price time zone. The controller 406 may determine the low-price time zone as a power saving time zone if at least one of the electricity usage amount and the electricity usage time exceeds a predetermined value and select the auxiliary power storage unit 402 as the power source.

The first switching element 409 is designed to select whether or not the external power supply unit 401 will be utilized as a power source of the electronic device 400 under control of the controller 406. The second switching element 410 is designed to select whether or not the external power supply unit will be utilized to charge the auxiliary power storage unit 402 under control of the controller 406.

In addition to a basic display function of the electronic device 400, the display 408 functions to show a message informing a user of selection of a power supply and charging of the battery 402 based on operation of the controller 406.

Figure 4:
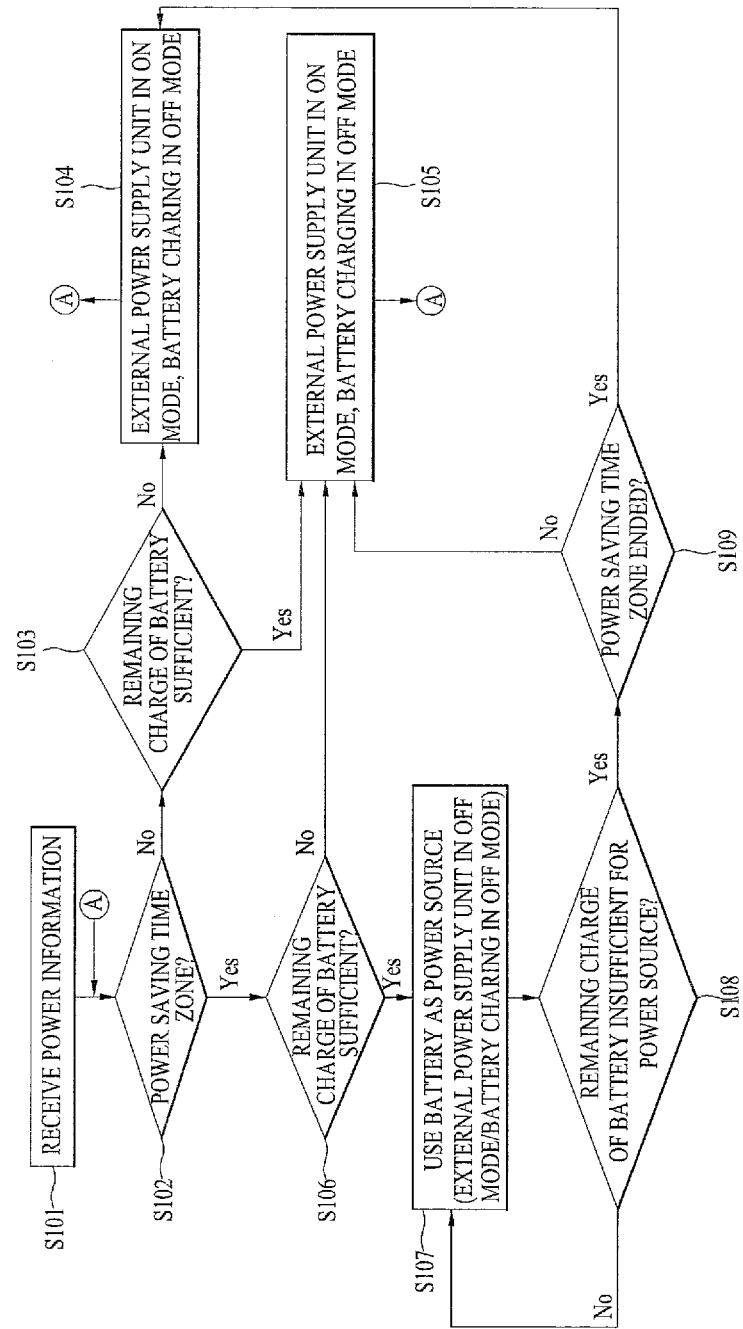
FIG. 4 is a flowchart illustrating a first example of a method of controlling a power supply in the electronic device in accordance with the first embodiment of the present invention.

Hereinafter, the first embodiment of the present invention will be described in detail with reference to FIGS. 4 to 6D. FIG. 4 is a flowchart illustrating one example of a method of controlling a power supply in the electronic device in accordance with the first embodiment of the present invention.

The power information receiver 407 receives power information via the smart grid power information network 100 or the internal network 200 (S101). The controller 406 judges whether or not the power saving time zone has arrived based on the received power information (S102). As described above, the power saving time zone, for example, may correspond to a high price time zone determined from electric rate information or an over demand time zone determined from power demand information.

Meanwhile, as described above, it may be possible to restrict at least one of amount and time of electricity usage in a low-price time zone for each customer such that a sudden increase in power demand for the low-price time zone can be prevented. For example, if at least one of the amount and the time of electricity usage of a customer in a low-price time zone exceeds a predetermined value, the electricity rate in the low-price time zone can be raised to same or similar to that of the high-price time zone.

The power information may include low-price time zone electricity use restriction information for restricting amount or the time of electricity usage in the low-price time zone. In This case, the controller 406 may determine the low-price time zone as a power saving time zone if at least one of the electricity usage amount and the electricity usage time exceeds a predetermined value.

If the controller 406 judges that the power saving time zone has not arrived, the controller 406 detects a charge of the battery 402 using the auxiliary power amount detector 405 (S103). For example, if the power saving time zone has not arrived and a remaining charge of the battery 402 is insufficient, the controller 406 controls the first switching element 409 to use the external power supply unit 401 and controls the second switching element 410 to allow charging of the battery 402 (S104). On the other hand, if the power saving time zone has not arrived, but the remaining charge of the battery 402 is sufficient, the controller 406 controls the first switching element 409 to use the external power supply unit 401 and controls the second switching element 410 to prevent charging of the battery 402 (S105).

If it is judged that the power saving time zone has arrived, the controller 406 detects the remaining charge of the battery 402 using the auxiliary power amount detector 405 (S106). For example, if the power saving time zone has arrived, the remaining charge of the battery 402 is insufficient, the controller 406 controls the first switching element 409 to use the external power supply unit 401 and controls the second switching element 410 to prevent charging of the battery 402 (S105). On the other hand, if the power saving time zone has reached and the remaining charge of the battery 402 is sufficient, the controller 406 controls utilization of the battery 402 as a power source (S107).

In operation S107, the controller 406 may control the first switching element 409 to intercept the external power supply unit 401, which also prevents charging of the battery 402. In another embodiment, if self-generated power is available, even if the power saving time zone has arrived and the remaining charge of the battery 402 is sufficient, the self-generated power may be used in operation 107. Alternatively, the above described control method may be applied even when the auxiliary power storage unit 402 is not detachably attached to the electronic device 400, but is an external battery provided in the home of the customer (e.g., 'home battery' not shown in the drawings). For example, under a situation in which the home battery is used, if the power saving time zone has arrived and the remaining charge of the home battery is sufficient, a control signal to use the home battery as a power source is generated in operation 107. The control signal to use the home battery may be directly generated from the corresponding electronic device 400, or may be generated via the smart server 201 provided in the home of the customer.

With operation S107, the battery 402 is utilized as a power source via the discharge circuit 404, and the controller 406 continuously detects, by means of the auxiliary power amount detector 405, whether or not the remaining charge of the battery 402 is sufficient for usage of the battery as a power source (S108).

If it is judged, in operation S108, that the remaining charge of the battery 402 is insufficient, the controller 406 judges whether or not the power saving time zone ends (S109). If the remaining charge of the battery is insufficient and the power saving time zone does not end, the controller 406 controls the first switching element 409 to use the external power supply unit 401 rather than the battery 402 and controls the second switching element 410 to prevent charging of the battery 402 (S105). If the remaining charge of the battery 402 is insufficient, but the power saving time zone ends, the controller 406 controls the first switching element 409 to use the external power supply unit 401 rather than the battery 402 and controls the second switching element 410 to allow charging of the battery 402 (S104).

During implementation of operations S104 and S105, whether or not the power saving time zone has arrived is continuously judged (S102), to continuously perform a control process without stoppage (A). For example, even if the external power supply unit 401 is utilized as a power source in operation S104, the power source may be switched from the external power supply unit 401 to the battery 402 if requirements of operations S102 and S106 are fulfilled.

With the embodiment of the present invention, in relation to the high price time zone or the over demand time zone corresponding to the power saving time zone, power previously charged in the battery 402 may be used rather than using external power supplied from an external source. In addition, charging of the battery 402 may be selectively performed according to the remaining charge of the battery 402. During a time other than the power saving time zone, external power is utilized not only to operate the electronic device 400, but also to charge the battery 402, which ensures effective use of power in consideration of the power saving time zone.

Figure 5:
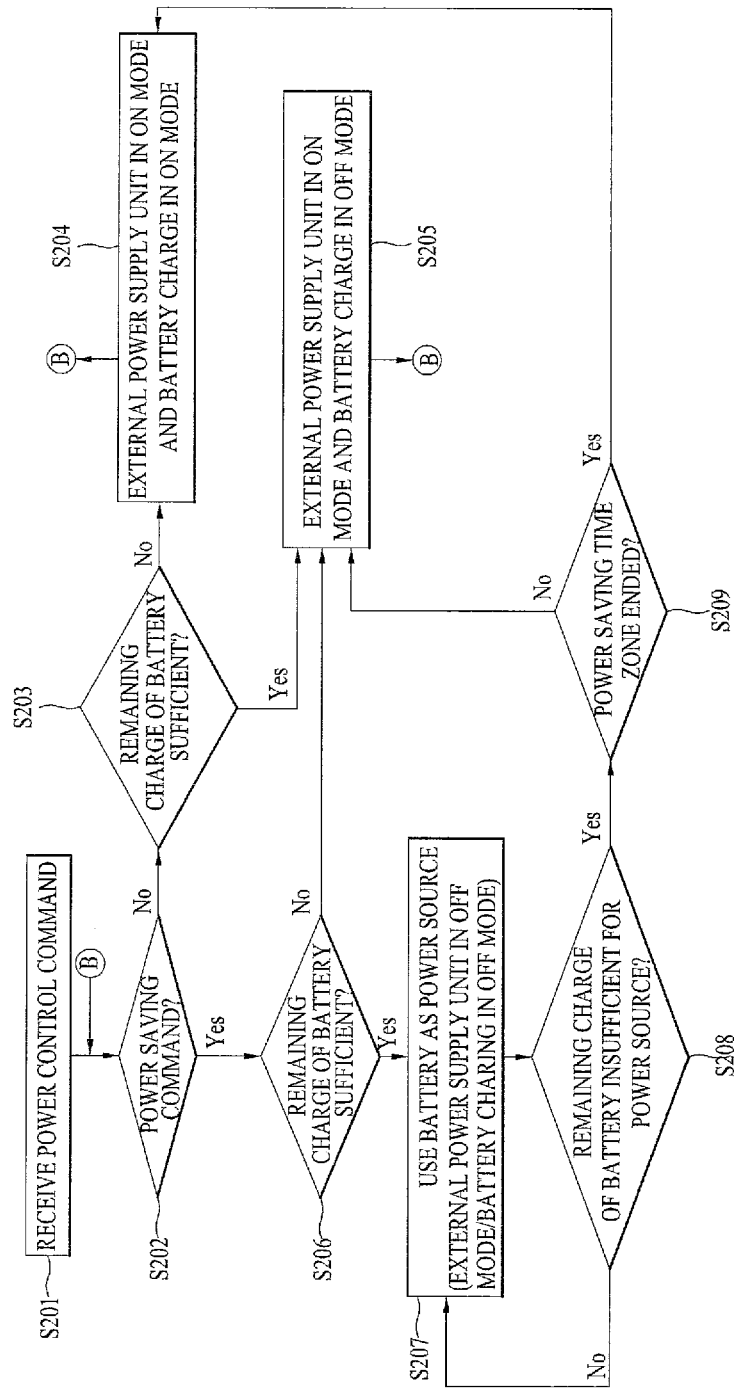
FIG. 5 is a flowchart illustrating a second example of the method of controlling the power supply in the electronic device in accordance with the first embodiment of the present invention.

FIG. 5 is a flowchart illustrating another example of the method of controlling the power supply in the electronic device in accordance with the first embodiment of the present invention. For example, the flowchart of FIG. 5 exemplifies an operation of the electronic device 400 based on a power saving command received from an external control device (e.g., the smart server 201) instead of judgment of the power saving time zone.

In other words, in the example of FIG. 5, instead of directly receiving power information (e.g., electric rate information and/or power demand information) and judging whether or not the power saving time zone has arrived as described above, the electronic device receives a power saving command from the external control device, such as the smart server 201 described above and thereafter, controls selection of a power supply based on the power saving command.

As compared to the above described example of FIG. 4, the power information receiving operation S101 is replaced with a power control command receiving operation S201, and the power saving time zone judging operations S102 and S109 may respectively be replaced with power saving command recognizing operations S202 and S209. This will be described as follows.

The power information receiver 407 receives a power control command via the smart grid power information network 101 or the external control device 201 (S201). The controller 406 confirms whether or not the received power control command contains power saving command information (S202). As described above, the power saving command is a command transmitted from the external control device 201 to the electronic device 400 after the external control device 201 judges that the power saving time zone has arrived. The power saving command may contain information about the power saving time zone or a particular time zone (date and time).

If the controller 406 judges that the power control command does not contain the power saving command information, the controller 406 detects a charge of the battery 402 using the auxiliary power amount detector 405 (S203). For example, if the power saving command is not present and the remaining charge of the battery 402 is insufficient, the controller 406 controls the first switching element 409 to use the external power supply unit 401 and controls the second switching element 410 to allow charging of the battery 402 (S204). On the other hand, if the power saving command is not present, but the remaining charge of the battery 402 is sufficient, the controller 406 controls the first switching element 409 to use the external power supply unit 401 and controls the second switching element 410 to prevent charging of the battery 402 (S205).

If it is judged from operation S202 that the power saving command is present, the controller 406 detects the remaining charge of the battery 402 using the auxiliary power amount detector 405 (S206). For example, if the power saving command is present, but the remaining charge of the battery 402 is insufficient, the controller 406 controls the first switching element 409 to use the external power supply unit 401 and controls the second switching element 410 to prevent charging of the battery 402 (S205). On the other hand, if the power saving command is present and the remaining charge of the battery 402 is sufficient, the controller 406 controls utilization of the battery 402 as a power source (S207). In operation S207, the controller 406 may control the first switching element 409 to intercept the external power supply unit 401, which also prevents charging of the battery 402.

In operation S207, the battery 402 is utilized as a power source via the discharge circuit 404. The controller 406 continuously detects, by means of the auxiliary power amount detector 405, whether or not the remaining charge of the battery 402 is insufficient for usage of the battery 402 as a power source (S208).

If it is judged, in operation S208, that the remaining charge of the battery 402 is insufficient for usage of the battery 402 as a power source, the controller 406 judges whether or not the power saving command is present (S209). In operation S202 in which the presence or absence of the initial power saving command is judged, if it is judged that a preset ending time value is present in a particular time zone, operation S209 may be realized by judging whether or not the preset ending time value reaches a reference ending value.

More particularly, if the remaining charge of the battery is insufficient and the power saving command does not end, the controller 406 controls the first switching element 409 to use the external power supply unit 401 rather than the battery 402 and controls the second switching element 410 to prevent charging of the battery 402 (S205). If the remaining charge of the battery 402 is insufficient, but the power saving command ends, the controller 406 controls the first switching element 409 to use the external power supply unit 401 rather than the battery 402 and controls the second switching element 410 to allow charging of the battery 402 (S204).

During implementation of operations S204 and S205, whether or not the power saving command is received is continuously judged (S202), to continuously perform a control process without stoppage (B). For example, even if the external power supply unit 401 is utilized as a power source in operation S204, the power source may be switched from the external power supply unit 401 to the battery 402 if requirements of operations S202 and S206 are fulfilled.

FIGS. 6A to 6D illustrate one example of alarm message screenshots displayed to the user on the display 408 in accordance with the first embodiment of the present invention. It is necessary to provide the user with alarm messages via a display screen on a per control operation basis of FIGS. 4 and 5.

Figure 6A:
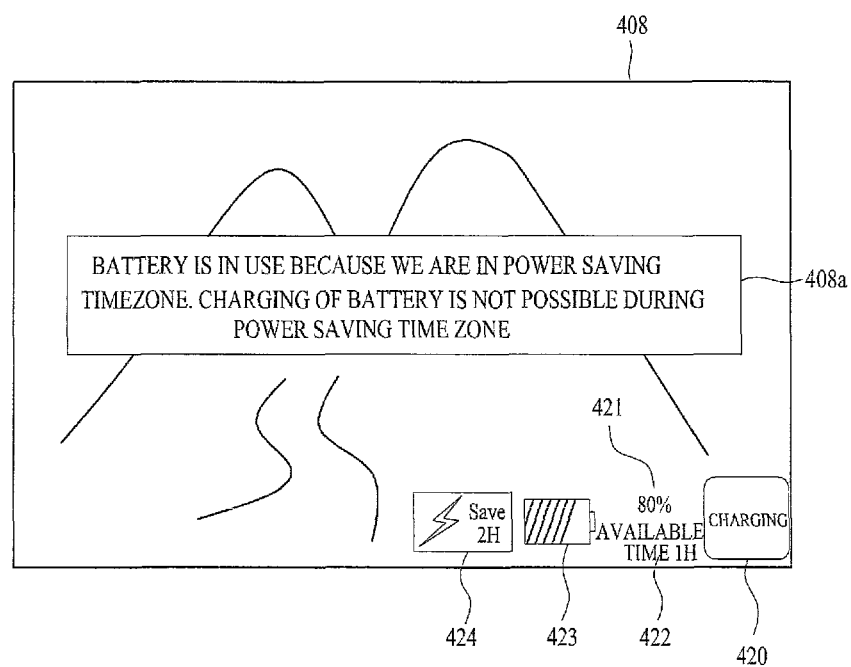
FIGS. 6A to 6D are schematic views illustrating message screenshots displayed to a user on the electronic device in accordance with the first embodiment of the present invention.

For example, FIG. 6A illustrates one example of a message alarm in relation to control operations S107 and S207. In operations S107 and S207, since the power saving time zone has arrived and power of the battery 402 is used, for example, a message "Battery is in use because we are in the power saving time zone. Charging of battery is not possible during the power saving time zone" is displayed as a popup 408*a*. A power supply that is being used may be displayed as a graphic symbol or text on one side of the display 408. For example, there are displayed a power saving guide graphic symbol 424 which indicates that the power saving time zone is active and also indicates a continuance time of the power saving time zone (e.g., two hours), a battery graphic symbol 423 and battery charge rate guide text 421 (e.g., '80%') which indicates a current charge rate of the battery, and power source guide text 422 (e.g., '1H') which indicates an available time of the battery that is being used as a power supply. A battery charging button 420 may further be provided to enable charging of the battery according to user selection even if the power saving time zone is active and thus, charging of the battery is not implemented. Thus, when the user wishes to additionally charge the battery with reference to the displayed graphic symbols or text, the user can perform charging of the battery by selecting the corresponding battery charging button 420.

Figure 6B:
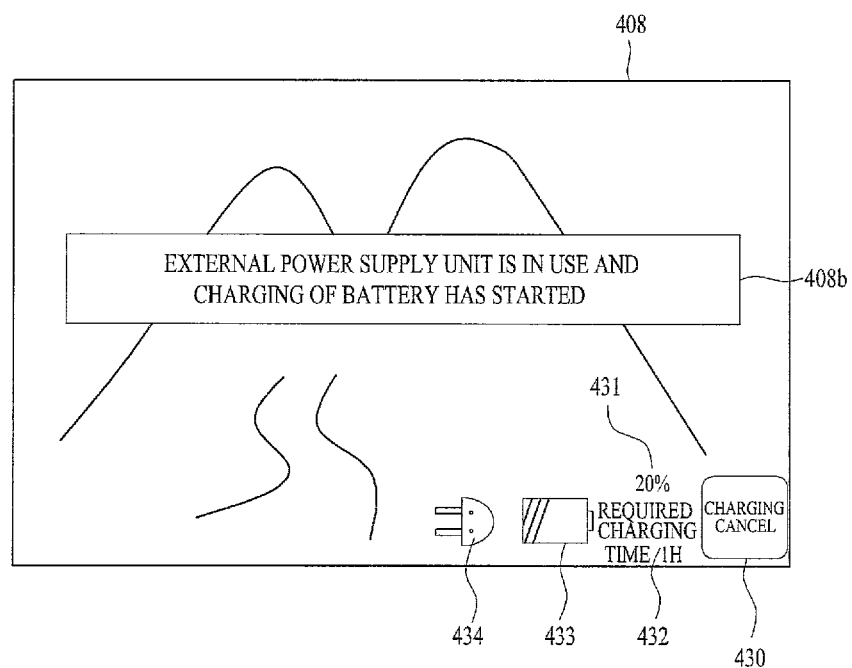

For example, FIG. 6B illustrates one example of an alarm message in relation to control operations S104 and S204. In operations S104 and S204, since the power saving time zone has not arrived and the remaining charge of the battery 402 is insufficient, for example, a message "External power supply unit is in use and charging of battery has started" is displayed as a popup 408*b*. A power supply that is being used may be displayed as a graphic symbol or text form on one side of the display 408. For example, there are displayed an external power supply guide graphic symbol 434 which indicates that the external power supply unit is in use, a battery graphic symbol 433 and battery charge guide text 431 (e.g., '20%') which indicate a current charge of the battery, and a guide text 432 (e.g., '1H') which indicates a time required to charge the battery. A battery charging cancel button 430 may further be provided to cancel charging of the battery according to user selection even if the battery is being charged. Thus, when the user wishes to cancel charging of the battery with reference to the displayed graphic symbols or text, the user can cancel charging of the battery by selecting the corresponding battery charging cancel button 430.

Figure 6C:
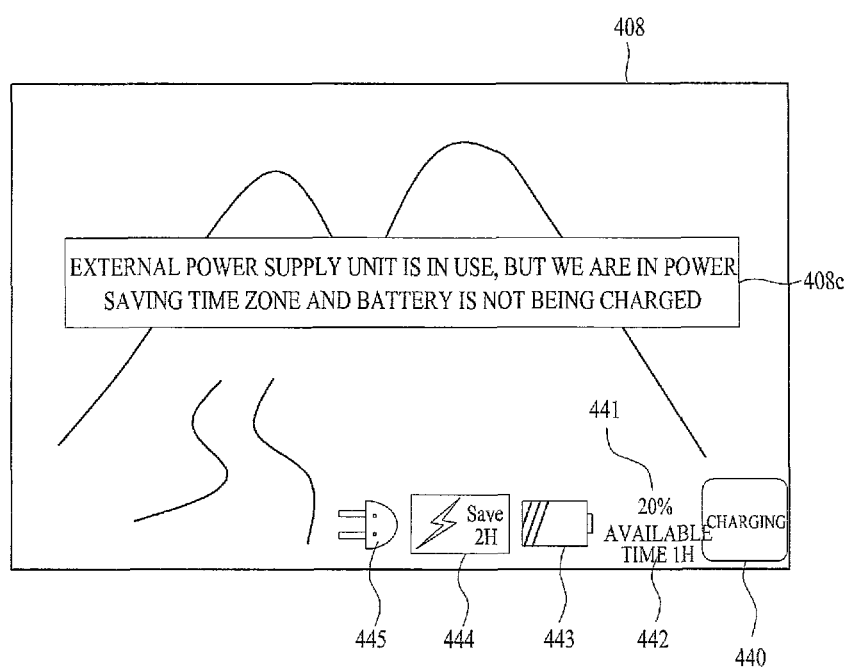

For example, FIG. 6C illustrates one example of an alarm message in relation to control operations S105 and S205. When operation S105 (or operation 205) is performed following operation S106 (or operation S206) or operation S109 (or operation S209), a message "External power supply unit is in use, but we are in the power saving time zone and the battery is not being charged" is displayed as a popup 408*c*. A power supply that is being used may be displayed as a graphic symbol or text on one side of the display 408. For example, there are displayed an external power supply unit guide graphic symbol 445 which indicates that the external power supply unit is in use, a power saving guide graphic symbol 444 which indicates that the power saving time zone is active and also indicates a continuance time of the power saving time zone (e.g., two hours), a battery graphic symbol 443 and battery charge guide text 441 (e.g., '20%') which indicate a current charge of the battery, and a guide text 442 (e.g., '1H') which indicates a time required to charge the battery. A battery charging button 440 may further be provided to enable charging of the battery according to user selection even if the power saving time zone is active and thus, charging of the battery is not implemented. Thus, when the user wishes to additionally charge the battery with reference to the displayed graphic symbols or text, the user can perform charging of the battery by selecting the corresponding battery charging button 440.

Figure 6D:
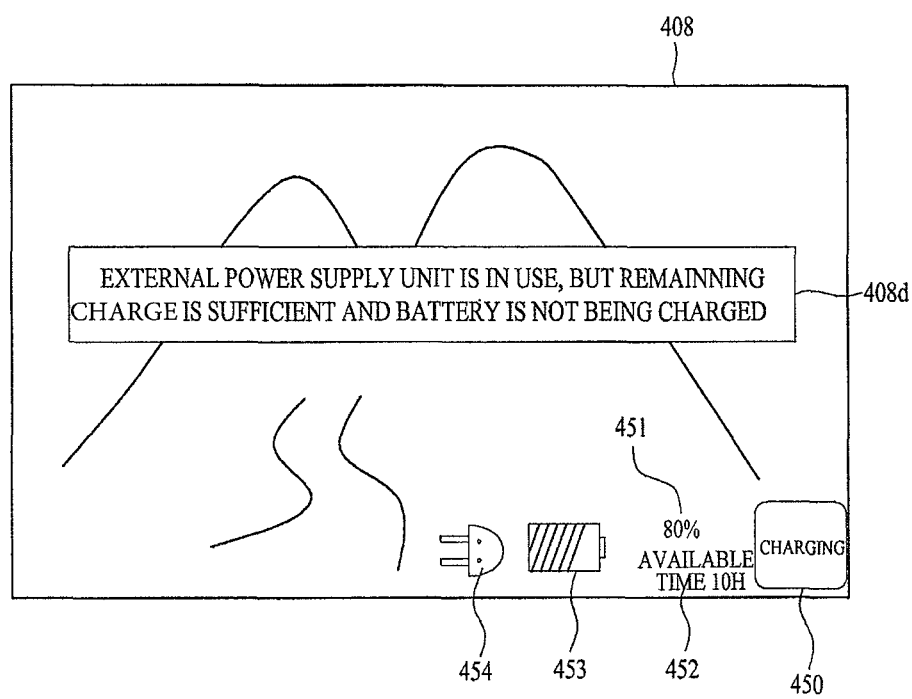

For example, FIG. 6D illustrates another example of an alarm message in relation to control operations S105 and S205. When operation S105 (or operation 205) is performed following operation S103 (or operation S203), a message "External power supply unit is in use, but the remaining charge of the battery is sufficient and thus, the battery is not being charged" is displayed as a popup 408*d*. A power supply that is being used may be displayed as a graphic symbol or text on one side of the display 408. For example, there are displayed an external power supply unit guide graphic symbol 454 which indicates that the external power supply unit is in use, a battery graphic symbol 453 and battery charge guide text 451 (e.g., '80%') which indicate a current charge of the battery, a guide text 452 (e.g., '1H') which indicates a time required to charge the battery. A battery charging button 450 may further be provided to enable charging of the battery according to user selection even if the remaining charge of the battery is sufficient (e.g., 80%) and thus, charging of the battery is not implemented. Thus, when the user wishes to additionally charge the battery with reference to the displayed graphic symbols or text, the user can perform charging of the battery by selecting the corresponding battery charging button 450.

Subsequent to the message of screenshots in FIGS. 6A to 6D, the user may select a power source or whether or not to charge the battery. In this case, the controller 406 controls the first switching element 409 and/or the second switching element 410 upon receiving a user command.

Figure 7A:
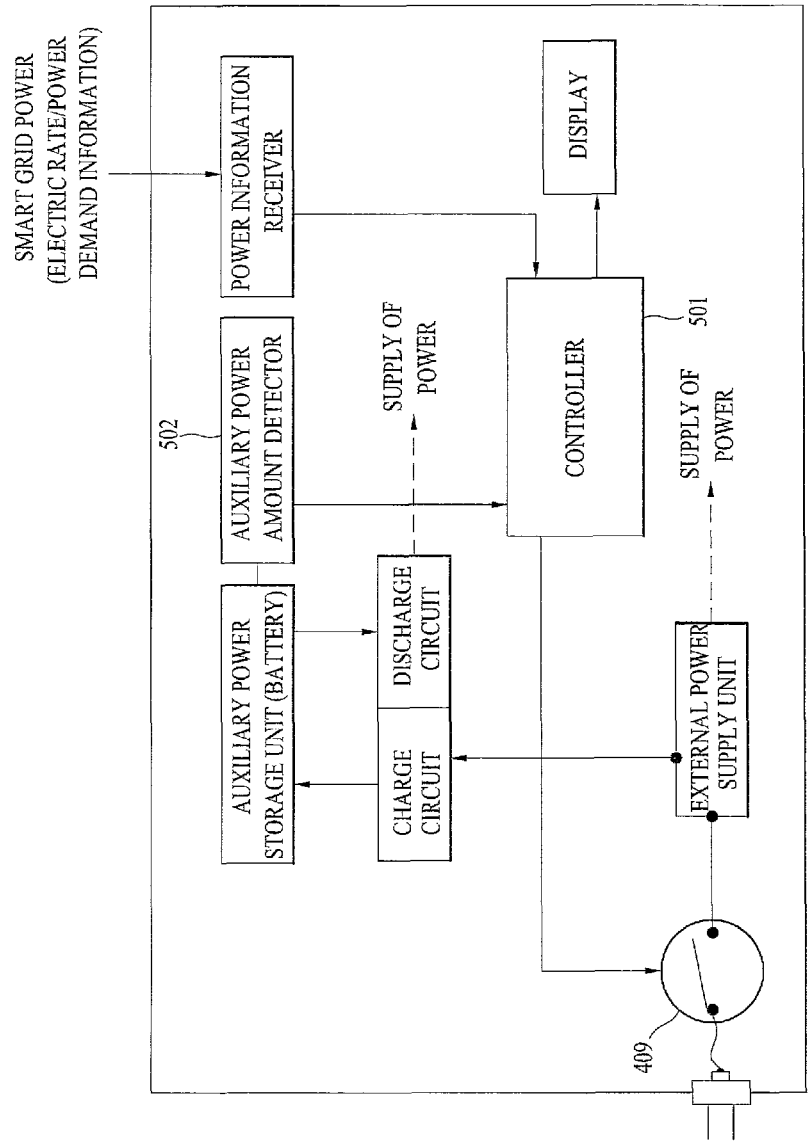
FIG. 7A is a block diagram illustrating an electronic device in accordance with a second embodiment of the present invention.
Figure 7B:
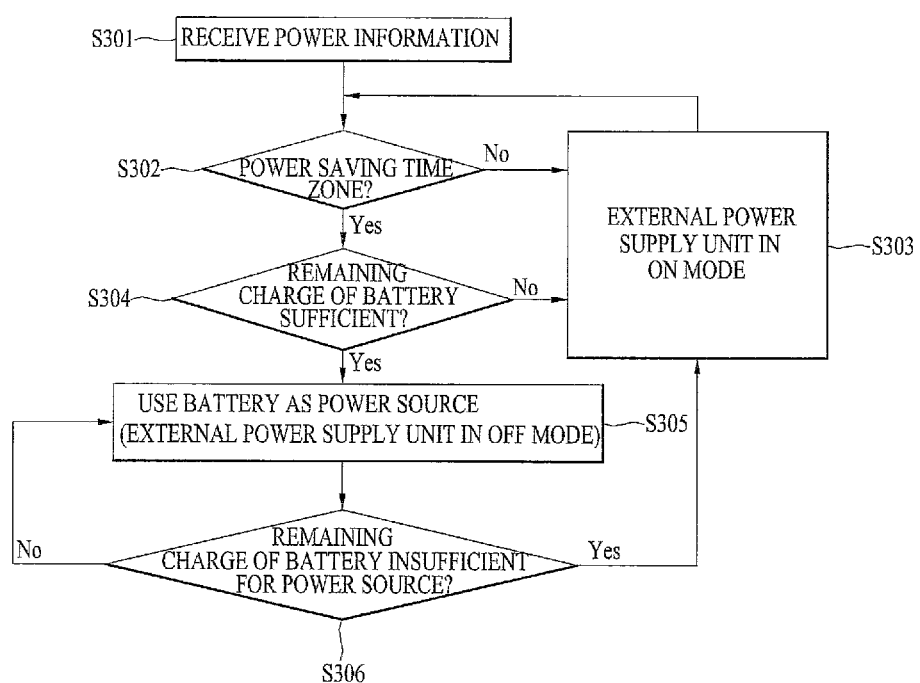
FIG. 7B is a flowchart illustrating a method of controlling a power supply in the electronic device in accordance with the second embodiment of the present invention.

FIG. 7A is a block diagram illustrating an electronic device in accordance with a second embodiment of the present invention, and FIG. 7B is a flowchart illustrating a method of controlling a power supply in the electronic device in accordance with the second embodiment of the present invention. Hereinafter, the second embodiment of the present invention will be described in detail with reference to FIGS. 7A and 7B.

As illustrated, the electronic device of FIG. 7A includes only the first switching element 409 that is used to select a power source without the second switching element 410 that is used to select whether or not to charge the battery. Hereinafter, this configuration will be described in detail with reference to FIGS. 7A and 7B.

A controller 501 judges whether or not the power saving time zone has arrived based on the received power information (S301). A method of judging the power saving time zone is identical to the above described method with reference to FIGS. 3 and 4.

If it is judged that the power saving time zone has not arrived, the controller 501 controls the first switching element 409 to utilize the external power supply unit as a power source (S303). Also, if it is judged that the power saving time zone has arrived, the controller 501 detects the remaining charge of the battery using an auxiliary power amount detector 502 (S304).

Thereafter, if the power saving time zone has arrived, but the remaining charge of the battery is insufficient, the controller 501 controls the first switching element 409 to continuously utilize the external power supply unit as a power source (S303). On the other hand, if the power saving time zone has arrived, but the remaining charge of the battery is sufficient, the controller 501 controls the first switching element 409 to intercept the external power supply unit in order to utilize power of the battery (S305).

Thereafter, with discharge of the battery, the controller judges whether or not the remaining charge of the battery is insufficient for usage of the battery as a power source (S306). If the remaining charge of the battery is insufficient, the controller 501 again controls the first switching element 409 to utilize the external power supply unit as a power source (S303).

Through the above described control method, any one of the external power supply unit and the battery can be used as a power source according to the power saving time zone and the remaining charge of the battery.

Although not shown in FIG. 7B, it will be appreciated that the flowchart of FIG. 7B may be modified into the above described control method according to whether or not the power saving command is received as described with reference to FIG. 5.

Figure 8A:
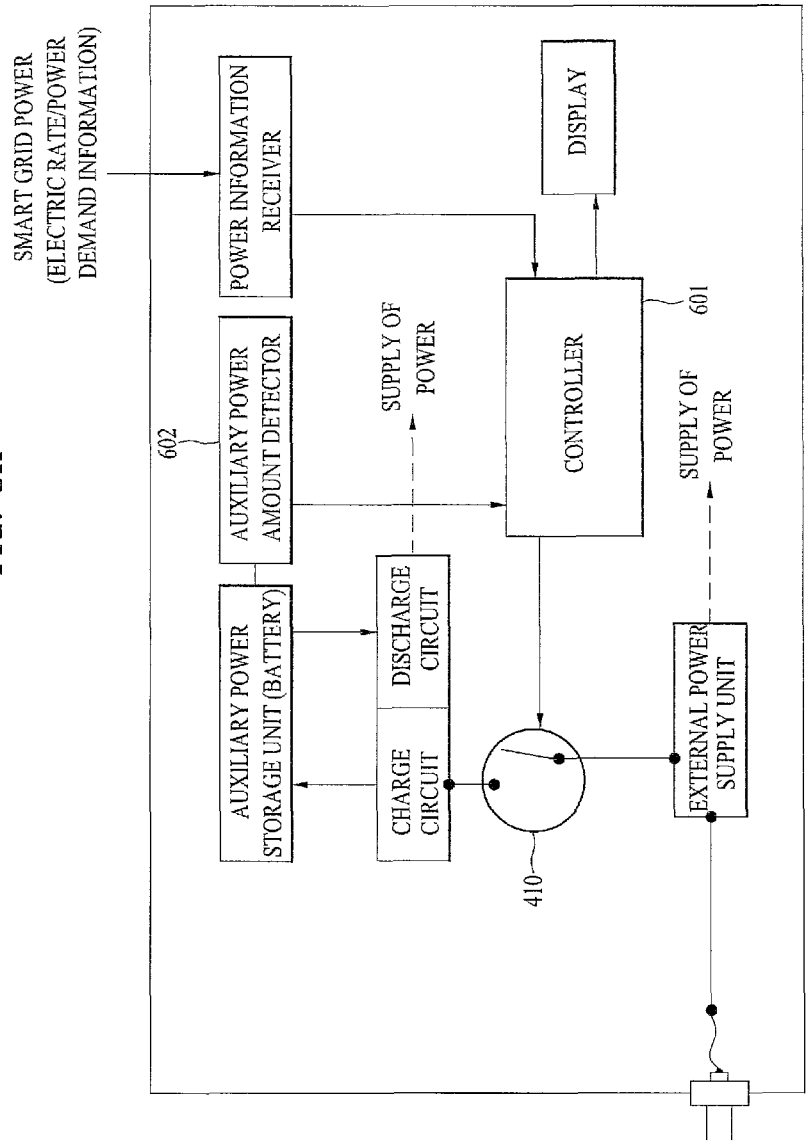
FIG. 8A is a block diagram illustrating an electronic device in accordance with a third embodiment of the present invention.
Figure 8B:
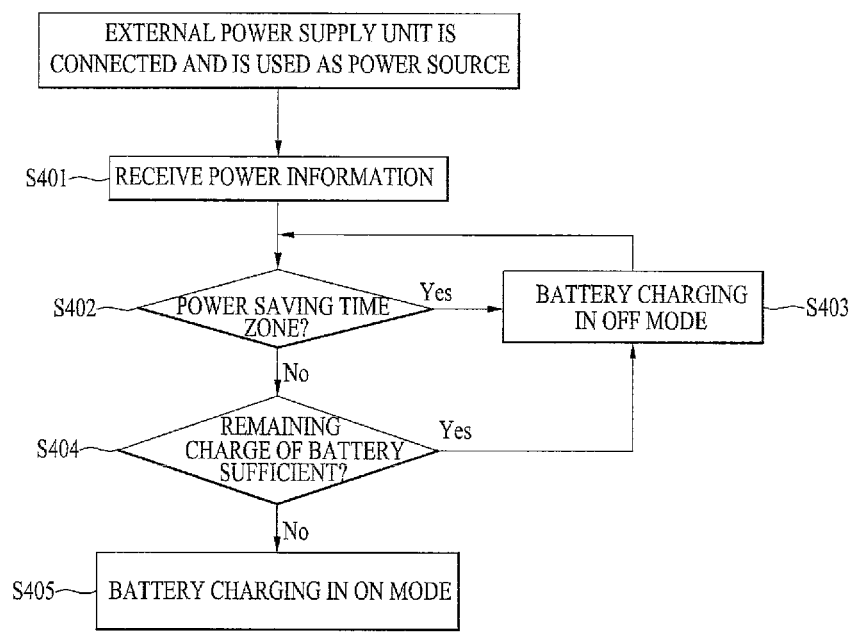
FIG. 8B is a flowchart illustrating a method of controlling a power supply in the electronic device in accordance with the third embodiment of the present invention.

FIG. 8A is a block diagram illustrating an electronic device in accordance with a third embodiment of the present invention, and FIG. 8B is a flowchart illustrating a method of controlling a power supply in the electronic device in accordance with the third embodiment of the present invention. Hereinafter, the third embodiment of the present invention will be described in detail with reference to FIGS. 8A and 8B.

As illustrated, the electronic device of FIG. 8 in accordance with the third embodiment includes only the second switching element 410 that is used to select whether or not to charge the battery without the first switching element 409 that is used to select a power source. Hereinafter, this configuration will be described with reference to FIGS. 8A and 8B. The embodiment of FIG. 8A exemplifies the case where only the external power supply unit is utilized as a power source in a state in which the external power supply unit is connected.

After power information is received (S401), the controller 601 judges whether or not the power saving time zone has arrived based on the received power information (S402). The method of judging that the power saving time zone has arrived is identical to the above described method with reference to FIGS. 3 and 4.

If it is judged that the power saving time zone has arrived, a controller 601 controls the second switching element 410 to prevent the battery from being charged by the external power supply unit (S403). Also, if it is judged that the power saving time zone has not arrived, the controller 601 detects the remaining charge of the battery using an auxiliary power amount detector 602 (S404). Thereafter, if the power saving time zone has not arrived, but the remaining charge of the battery is sufficient, similarly, the controller 601 controls the second switching element 410 to prevent the battery from being charged by the external power supply unit (S403).

If the power saving time zone has not arrived and the remaining charge of the battery is insufficient, the second switching element 410 is controlled to allow charging of the battery, in order to charge the battery using the external power supply unit (S405).

Through the above described control method, it is possible to selectively determine whether or not to charge the battery according to the power saving time zone and the remaining charge of the battery. Thereby, it is possible to prevent unnecessary and ineffective charging of the battery when the remaining charge of the battery is sufficient or when the power saving time zone has arrived.

Although not shown in FIG. 8B, it will be appreciated that the flowchart of FIG. 8B may be modified into the above described control method according to whether or not the power saving command is received as described with reference to FIG. 5.

Hereinafter, an electronic device and a power supply control method thereof in accordance with a fourth embodiment of the present invention will be described in detail.

Figure 9A:
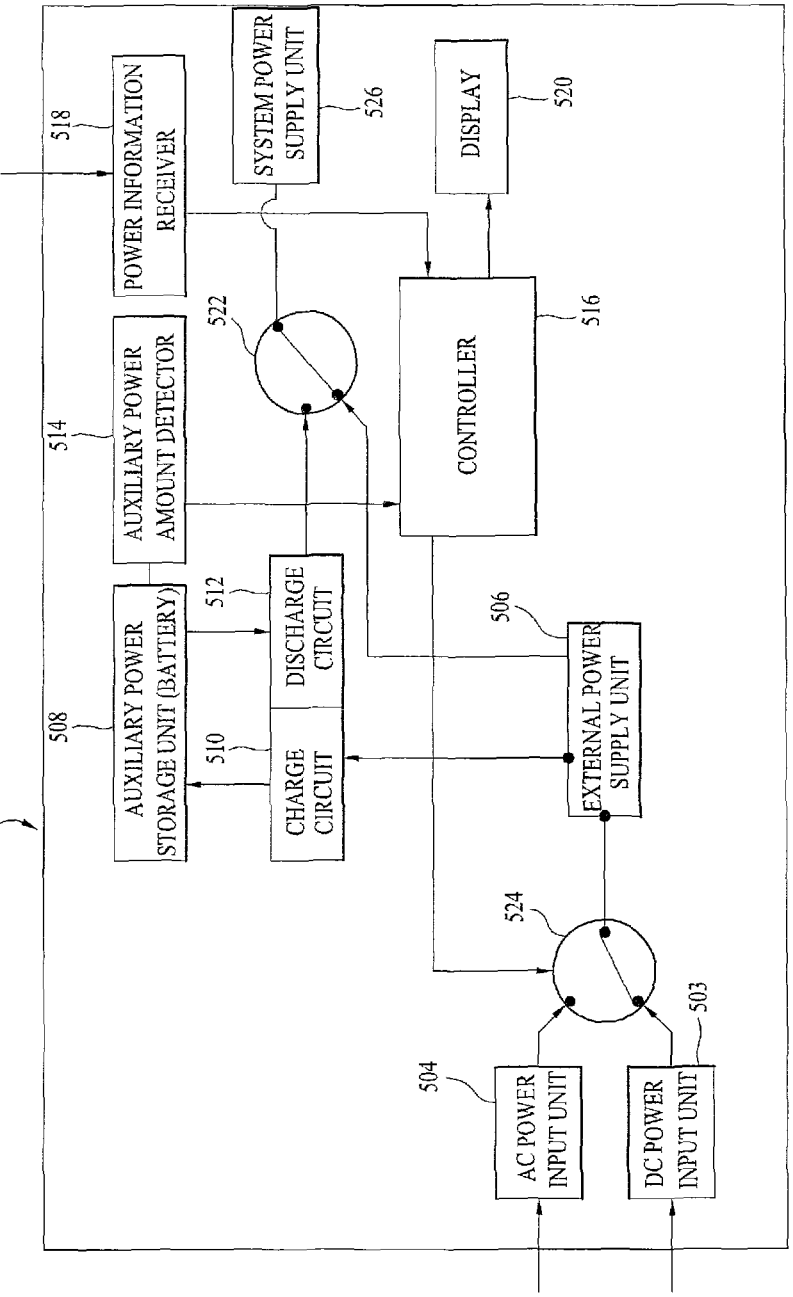
FIG. 9A is a block diagram illustrating an electronic device in accordance with a fourth embodiment of the present invention.

FIG. 9A is a block diagram illustrating the electronic device in accordance with the fourth embodiment of the present invention. As illustrated in FIG. 9, an electronic device 500 in accordance with the present embodiment includes a DC power input unit 503, an AC power input unit 504, an external power supply unit 506, an auxiliary power storage unit 508 (hereinafter, referred to also as a 'battery'), a charge circuit 510, a discharge circuit 512, an auxiliary power amount detector 514, a controller 516, a power information receiver 518, a display 520, a first switching element 522, a third switching element 524, and a system power supply unit 526.

It is to be appreciated that all the aforementioned components are illustrated as functional blocks for convenience of description and may be present in a tangible form or be embodied into a software program in practical applications. In exemplary embodiments of the present invention, some of the aforementioned components are not essential, but are merely additional components.

The DC power input unit 503 receives DC power fed from an external DC power storage device and feeds the DC power to the external power supply unit 506. In this case, the DC power storage device may be selected from various domestic power storage devices.

The AC power input unit 504 receives AC power fed from an external AC power source and feeds the AC power to the external power supply unit 506.

The third switching element 524 is connected to the AC power input unit 504 and the DC power input unit 503 and serves to select any one of AC power and DC power supply as power source.

The external power supply unit 506 receives power from the outside of the electronic device 500 via the AC power input unit 504 or the DC power input unit 503 and feeds the power to the electronic device 500. The power may be commercial power provided by a utility company and billed on a watt/hour basis, or may be self-generated power (e.g., solar heat energy and wind force energy) generated by a self-generation facility of a recipient.

The charge circuit 510 charges the auxiliary power storage unit 508 so as to store power in the auxiliary power storage unit 508, and the discharge circuit 512 enables supply of power from the auxiliary power storage unit 508 to the electronic device 500. The auxiliary power amount detector 514 detects an available amount of power or a charged amount of power in the auxiliary power storage unit 508 and transmits the detected result to the controller 516.

The power information receiver 518 receives power information via the smart grid power information network 100 or the internal network 200. The power information may be a power control command received from the external control device (e.g., the smart server 201). Also, the power information may be provided in real time or periodically at a constant time interval and may include electric rate information and/or power demand information according to design requirements.

The power information receiver 518 may receive information about self-generation. The information about self-generation may include information indicating the amount of power self-generated by a recipient, information indicating an available extra amount of self-generated power, and information indicating whether or not power supplied to the external power supply unit is self-generated power.

More particularly, in one example, the electric rate information means information about electric use hour that is changeable in real time or periodically. Thus, an electric charge with respect to a current time zone is ascertainable upon receiving the electric rate information and it is also ascertainable whether the current time zone corresponds to a high-price time zone or a low-price time zone on the basis of a predetermined reference. For example, the power supplier fixes an electric charge at a time of high electricity demand (referred to as a 'peak time') to a high price, which may cause a user to reduce electricity usage. On the other hand, an electric charge at a time of less electricity demand is fixed to a low price, which may cause the user to use electricity during the low-price time zone rather than the high-price time zone.

The power demand information includes information about a power demand that is changeable in real time or periodically. The power demand information is obtained by analyzing a previous power use aspect of each recipient with respect to the smart grid power information network 100 or based on information about a required wattage of power that is provided from each recipient. Thus, a power demand in a current time zone is ascertainable upon receiving the power demand information, and it is also ascertainable whether or not the current time zone corresponds to an over demand time zone or a low demand time zone on the basis of a predetermined reference. For example, an electric charge may be fixed highly in the over demand time zone of high electricity demand, or an additional incentive or penalty may be imposed regardless of an electric charge, which may cause the user to reduce electricity usage.

In this way, the controller 516 judges a power saving time zone from the power information received by the power information receiver 518 and determines selection of a power source corresponding to the power saving time zone. For example, the high price time zone or the over demand time zone may be judged as the power saving time zone. Whether a particular time belongs to the high price time zone or the over demand time zone can be freely set by the user or a system.

The first switching element 522 is designed to select whether or not the external power supply unit 506 will be utilized as a power source of the electronic device 500 under control of the controller 516. The third switching element 524 is designed to select whether to feed AC power or DC power to the external power supply unit 506 under control of the controller 516.

In addition to a basic display function of the electronic device 500, the display 520 functions to show a message informing a user of selection of a power supply and charging of the battery 508 based on operation of the controller 516.

Figure 9B:
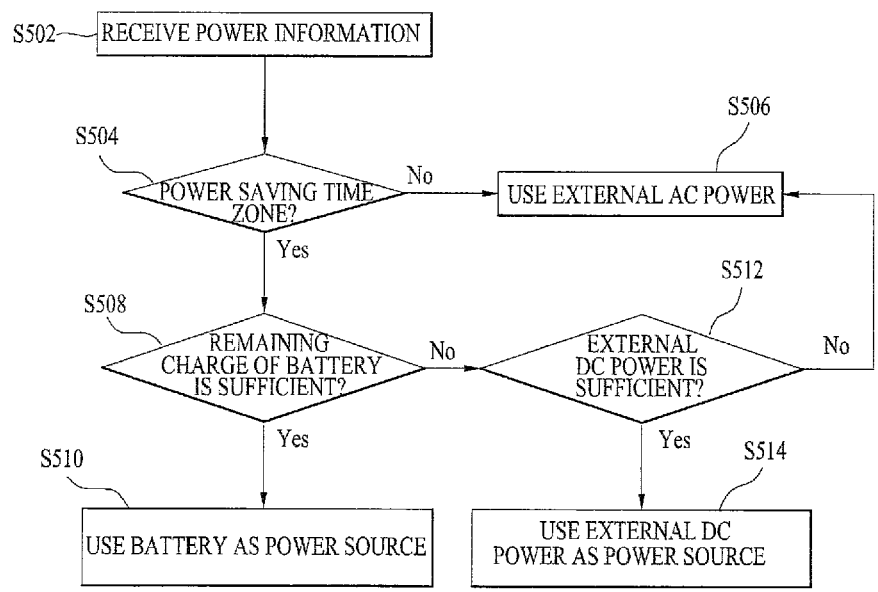
FIG. 9B is a flowchart illustrating a method of controlling a power supply in the electronic device in accordance with the fourth embodiment of the present invention.

FIG. 9B is a flowchart illustrating a method of controlling a power supply in the electronic device in accordance with the fourth embodiment of the present invention. Hereinafter, the fourth embodiment of the present invention will be described in detail with reference to FIG. 9B.

The power information receiver 518 receives power information via the smart grid power information network 100 or the internal network 200 (S502). The controller 516 judges whether or not the power saving time zone has arrived based on the received power information (S504). As described above, the power saving time zone, for example, may correspond to a high price time zone determined from electric rate information or an over demand time zone from power demand information.

If the controller 516 judges that the power saving time zone has not arrived, the controller 516 controls the first switching element 512 and the third switching element 524 to enable supply of external AC power (S506).

Figure 10A:
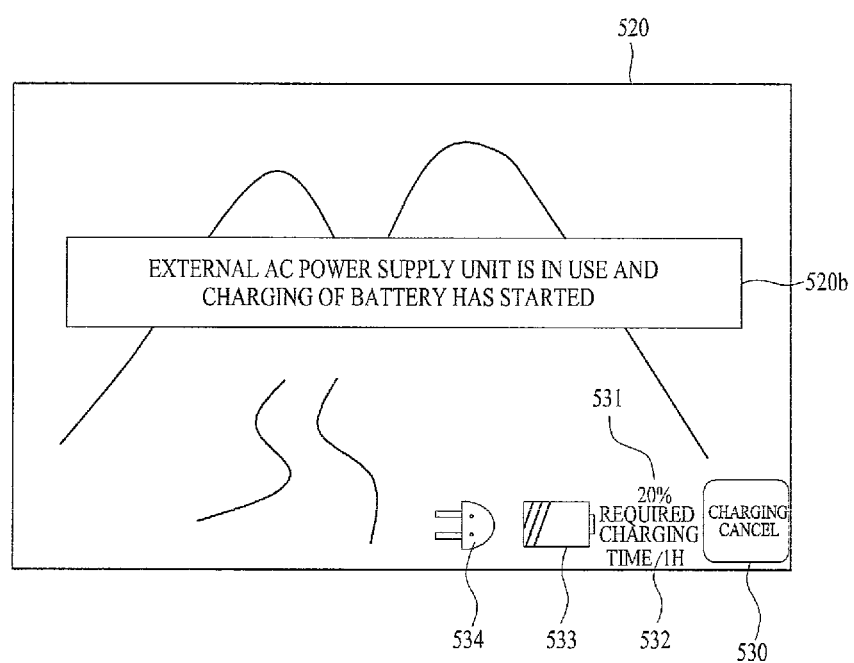
FIGS. 10A and 10B are schematic views illustrating message screenshots displayed to a user on the electronic device in accordance with the fourth embodiment of the present invention.

In this case, as illustrated in FIG. 10A, a message "External power supply unit is in use and charging of battery has started" is displayed as a popup 520b. Power that being used may be displayed as a graphic symbol or text on one side of the display 520. For example, there are displayed an external power supply unit guide graphic symbol 534 which indicates that the external power supply unit is in use, a battery graphic symbol 533 and battery charge guide text 531 (e.g., '20%') which indicate a current charge of the battery, and a guide text 532 (e.g., '1H') which indicates a time required to charge the battery. A battery charging cancel button 530 may further be provided to cancel charging of the battery according to user selection even if the battery is being charged. Thus, when the user wishes to cancel charging of the battery with reference to the displayed graphic symbols or text, the user can cancel charging of the battery by selecting the corresponding battery charging cancel button 530.

If the power saving time zone has arrived, the controller 516 detects the remaining charge of the battery 508 via the auxiliary power amount detector 514 (S508).

In this case, if the power saving time zone has arrived, but the remaining charge of the battery is insufficient, the controller 516 detects whether or not external DC power, i.e. the power charged in the external DC power storage device is sufficient (S512). If the power is sufficient, the controller 516 controls the first switching element 522 and the third switching element 524 to enable supply of external DC power (S514).

Figure 10B:
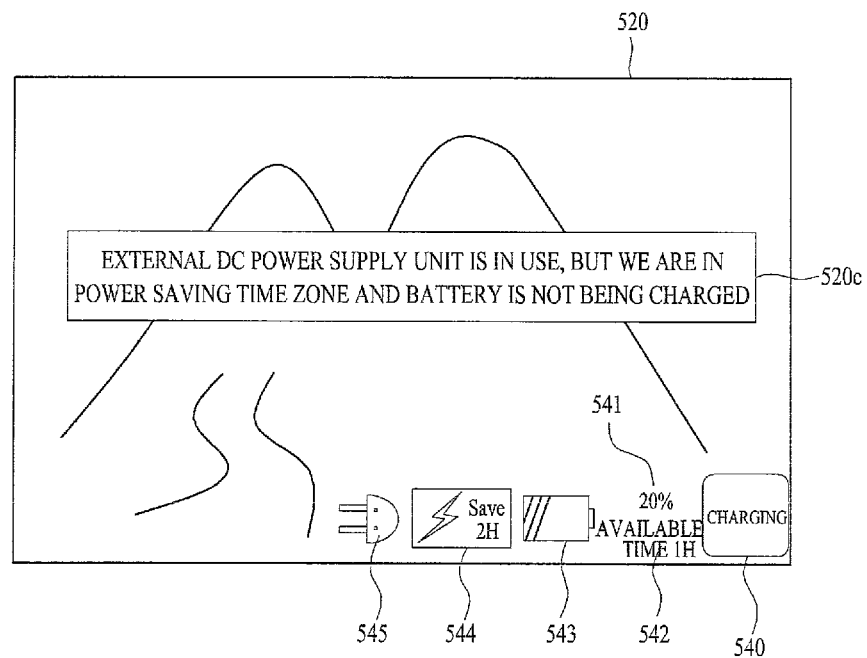

In this case, as illustrated in FIG. 10B, a message "External power supply unit is in use, but we are in the power saving time zone and battery is not being charged" is displayed as a popup 520c. Power that is being used may be displayed as a graphic symbol or text form on one side of the display 520. For example, there are displayed an external power supply unit guide graphic symbol 545 which indicates that the external power supply unit is in use, a power saving guide graphic symbol 544 which indicates that the power saving time zone is active and also indicates a continuance time of the power saving time zone (e.g., two hours), a battery graphic symbol 543 and battery charge guide text 541 (e.g., '20%') which indicate a current charge of the battery, a guide text 542 (e.g., '1H') which indicates a time required to charge the battery. A battery charging button 540 may further be provided to enable charging of the battery according to user selection even if the power saving time zone is active and thus, charging of the battery is not implemented and thus, charging of the battery is not implemented. Thus, when the user wishes to additionally charge the battery with reference to the displayed graphic symbols or text, the user can perform charging of the battery by selecting the corresponding battery charging button 540.

If the power saving time zone has arrived and the remaining charge of the battery 508 and the power charged in the DC power storage device are insufficient, the controller 516 controls the first switching element 522 and the third switching element 524 to enable supply of external AC power (S506).

On the other hand, if the power saving time zone has arrived and the remaining charge of the battery 508 is sufficient, the power of the battery 508 is fed to the electronic device 500 under control of the controller 516 (S510).

In this case, as illustrated in FIG. 6A, for example, a message "Battery is in use because we are in the power saving time zone. Charging of battery is not possible during the power saving time zone" may be displayed on the display 520. For example, there are displayed the power saving guide graphic symbol 424 which indicates that the power saving time zone is active and also indicates a continuance time of the power saving time zone (e.g., two hours), the battery graphic symbol 423 and the battery charge rate guide text 421 (e.g., '80%') which indicates a current charge rate of the battery, and the power source guide text 422 (e.g., '1H') which indicates an available time of the battery that is being used as a power supply. The battery charging button 420 may further be provided to enable charging of the battery according to user selection even if the power saving time zone is active and thus, charging of the battery is not implemented. Thus, when the user wishes to additionally charge the battery with reference to the displayed graphic symbols or text, the user can perform charging of the battery by selecting the corresponding battery charging button 420.

The controller 516 may continuously confirm whether or not the power saving time zone has arrived, so as to continuously perform a control process without stoppage. For example, regardless of whether the external AC power or the external DC power is fed, the controller 516 may continuously receive power information, confirm whether or not the power saving time zone has arrived, and switch the external power supply unit into the battery or vice versa.

Through the above described embodiments of the present invention, during the power saving time zone corresponding to the high price time zone or the over demand time zone, the power charged in the battery may be used instead of commercial power fed from an external AC source. Also, even if the power saving time zone has arrived, external DC power stored in the external DC power storage device may be selectively used based on the remaining charge of the battery.

As is apparent from the above description, in accordance with various embodiments proposed herein, it is possible to select a power supply suitable for reducing power consumption and to prevent an unnecessary electric charging of a battery, which enables economic and efficient power consumption of electronic devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electronic device including a display screen, comprising:
   an external power supply unit configured to receive power from an external power source;
   an auxiliary power storage unit configured to be charged upon receiving the power from the external power supply unit and store the power;
   a first switching element connected to the external power supply unit and the auxiliary power storage unit and configured to select any one power unit of the external power supply unit and the auxiliary power storage unit as a power source;
   a power information receiver configured to receive power information including at least one of electric rate information and power demand information;
   a controller configured to control the first switching element based on the power information received from the power information receiver; and
   a display configured to provide a popup window having an alarm message on the display screen,
   wherein the alarm message provides two kinds of information together within the popup window, the two kinds of information including first information that indicates the selected power unit by the first switching element, and second information that indicates whether the auxiliary power storage unit is being charged or not based on the selected power supply unit and the received power information, and
   wherein the alarm message is provided with at least one of four message types including:
      a message indicating the auxiliary power storage unit is selected and charging of the auxiliary power storage unit is not possible, a message indicating the external power supply unit is selected and charging of the auxiliary power storage unit is started, a message indicating the external power supply unit is selected and charging of the auxiliary power storage unit is not possible due to power saving period, and a message indicating the external power supply unit is selected and charging of the auxiliary power storage unit is not possible due to sufficient remaining charge of the auxiliary power storage unit.

2. The electronic device according to claim 1, wherein the controller is configured to judge a high price time zone determined from the electric rate information or an over demand time zone determined from the power demand information as a power saving time zone, and is configured to control the first switching element to select the auxiliary power storage unit as the power source during the power saving time zone.

3. The electronic device according to claim 2, further comprising:

a second switching element to select whether or not to charge the auxiliary power storage unit with the power fed from the external power supply unit, wherein the controller is configured to control the second switching element to prevent charging of the auxiliary power storage unit during the power saving time zone.

4. The electronic device according to claim 3, further comprising:

an auxiliary power amount detector configured to detect the amount of auxiliary power charged in the auxiliary power storage unit and output information about the amount of auxiliary power to the controller.

5. The electronic device according to claim 4, wherein the controller is configured to control the second switching element to allow the auxiliary power storage unit to be charged with the power fed from the external power supply unit if the amount of auxiliary power detected by the auxiliary power amount detector is a reference value or less and the power saving time zone has not arrived.

6. The electronic device according to claim 4, wherein the controller is configured to control the first switching element to select the external power supply unit as the power source if the amount of auxiliary power detected by the auxiliary power amount detector is a reference value or less.

7. The electronic device according to claim 1, further comprising:

an alternating current (AC) power input unit configured to receive AC power from an external AC power source and feed the AC power to the external power supply;

a direct current (DC) power input unit configured to receive DC power from an external DC power storage device and feed the DC power to the external power supply; and a third switching element connected to the AC power input unit and the DC power input unit and configured to select any one of the AC power and the DC power as power source, wherein the controller is configured to control the third switching element to select any one of the DC power and the AC power as a power source based on the power information.

8. The electronic device according to claim 7, wherein the controller judges a high price time zone determined from the electric rate information or an over demand time zone determined from the power demand information as a power saving time zone and controls the third switching element to select the DC power as the power source during the power saving time zone.

9. The electronic device according to claim 7, wherein the controller is configured to control the third switching element to select the AC power as the power source if the amount of DC power stored in the external DC power storage device is a reference value or less.

10. The electronic device according to claim 1, wherein the power information further includes low-price time zone electricity use restriction information for restricting at least one of amount and time of electricity usage in a low-price time zone, and wherein the controller is further configured to:

control the display to display at least one of electricity usage amount information and electricity usage time information in the low-price time zone, determine a power saving time zone based on at least one of the electricity usage amount information and the electricity usage time information, and select the auxiliary power storage unit as the power source during the power saving time zone.

11. A method of controlling a power supply in an electronic device, the method comprising:

receiving power information including at least one of electric rate information and power demand information;

selecting any one power unit of an external power supply unit, which is configured to receive power from an external source, and an auxiliary power storage unit which is charged upon receiving the power fed from the external power supply unit and stores the power, as a power source based on the power information received from a power information receiver; and displaying a popup window having an alarm message on the display screen, wherein the alarm message provides two kinds of information together within the popup window, the two kinds of information including first information that indicates the selected power unit by the first switching element, and second information that indicates whether the auxiliary power storage unit is being charged or not based on the selected power supply unit and the power information, and wherein the alarm message is provided with at least one of four message types including:

a message indicating the auxiliary power storage unit is selected and charging of the auxiliary power storage unit is not possible, a message indicating the external power supply unit is selected and charging of the auxiliary power storage unit is started, a message indicating the external power supply unit is selected and charging of the auxiliary power storage unit is not possible due to power saving period, and a message indicating the external power supply unit is selected and charging of the auxiliary power storage unit is not possible due to sufficient remaining charge of the auxiliary power storage unit.

12. The method according to claim 11, wherein the selecting includes:

judging a high price time zone determined from the electric rate information or an over demand time zone determined from the power demand information as a power saving time zone; and selecting the auxiliary power storage unit as the power source during the power saving time zone.

13. The method according to claim 12, further comprising:
preventing charging of the auxiliary power storage unit during the power saving time zone.

14. The method according to claim 11, further comprising:
detecting the amount of auxiliary power stored in the auxiliary power storage unit; and
charging the auxiliary power storage unit with the power fed from the external power supply unit if the detected amount of auxiliary power is a reference value or less and the power saving time zone has not arrived.

15. The method according to claim 11, further comprising:
detecting the amount of auxiliary power stored in the auxiliary power storage unit; and
selecting the external power supply unit as the power source if the detected amount of auxiliary power is a reference value or less.

16. The method according to claim 11, wherein the power is any one of AC power fed from an external AC power source and DC power fed from an external DC power storage device, and
wherein the selecting includes selecting any one of the DC power and the AC power as a power source based on the power information.

17. The method according to claim 16, further comprising:
judging a high price time zone determined from the electric rate information or an over demand time zone determined from the power demand information as a power saving time zone; and
selecting the DC power as the power source during the power saving time zone.

18. The method according to claim 17, wherein the AC power is selected as the power source if the amount of DC power stored in the external DC power storage device is a reference value or less.

19. The method according to claim 11, wherein the power information further includes low-price time zone electricity use restriction information for restricting at least one of amount and time of electricity usage in a low-price time zone, and
wherein the method further comprises:
displaying at least one electricity usage amount information and electricity usage time information in the low-price time zone;
determining a power saving time zone based on at least one of the electricity usage amount information and the electricity usage time information; and
selecting the auxiliary power storage unit as the power source during the power saving time zone.

* * * * *